(12) United States Patent
Chen

(10) Patent No.: US 6,426,880 B1
(45) Date of Patent: Jul. 30, 2002

(54) SURFACE MOUNTED DEVICE WITH GROOVES ON A TERMINATION LEAD

(75) Inventor: Philip H. Chen, Tigart, OR (US)

(73) Assignee: Intermedics, Inc., Angleton, TX (US)

( * ) Notice: Subject to any disclaimer, the term of this patent is extended or adjusted under 35 U.S.C. 154(b) by 0 days.

(21) Appl. No.: 09/518,284

(22) Filed: Mar. 3, 2000

Related U.S. Application Data

(63) Continuation of application No. 09/204,531, filed on Dec. 3, 1998, now Pat. No. 6,246,587.

(51) Int. Cl.[7] .................................................. H05K 3/32
(52) U.S. Cl. ........................ 361/773; 361/760; 361/781; 257/737; 257/739; 257/778; 174/260; 29/832; 29/840; 438/108; 438/665; 228/180.22
(58) Field of Search .......................... 361/760, 772–774, 361/781–783; 257/692, 693, 696, 697, 737–739, 778; 174/259, 260; 439/83, 876; 29/832, 840; 438/108, 613, 665, 666; 228/180.21, 180.22

(56) References Cited

U.S. PATENT DOCUMENTS

| 4,442,966 A | | 4/1984 | Jourdain et al. ............ 228/122 |
|---|---|---|---|
| 4,818,823 A | * | 4/1989 | Bradley ....................... 361/773 |
| 4,836,435 A | * | 6/1989 | Napp et al. ............ 228/180.22 |
| 5,241,134 A | | 8/1993 | Yoo ............................ 361/772 |
| 5,344,343 A | | 9/1994 | Seidler ........................ 439/876 |
| 5,446,244 A | * | 8/1995 | Kawanabe et al. .... 228/180.21 |
| 5,519,251 A | | 5/1996 | Sato et al. .................. 257/666 |
| 5,545,589 A | | 8/1996 | Tomura et al. ............. 438/114 |
| 5,628,919 A | | 5/1997 | Tomura et al. ............... 216/18 |
| 5,823,801 A | | 10/1998 | Elkhatib ....................... 439/83 |
| 5,828,128 A | | 10/1998 | Higashiguchi et al. ...... 257/738 |
| 5,879,206 A | | 3/1999 | Badgley et al. ............. 439/876 |
| 5,889,657 A | * | 3/1999 | Kono .......................... 361/773 |
| 6,005,290 A | * | 12/1999 | Akram et al. ................ 257/739 |
| 6,040,626 A | | 3/2000 | Cheah et al. ................ 257/735 |
| 6,083,666 A | * | 7/2000 | Kim ............................ 438/613 |
| 6,137,063 A | * | 10/2000 | Jiang .......................... 361/773 |
| 6,324,754 B1 | * | 12/2001 | DiStefano et al. ............ 29/840 |

FOREIGN PATENT DOCUMENTS

| EP | 0560188 | 3/1992 | .......... H01R/23/72 |
|---|---|---|---|
| GB | 2308736 | 12/1995 | .......... H01L/23/36 |
| JP | 56-104459 A | * 8/1981 | .......... H01L/23/48 |
| JP | 07-086470 | 3/1995 | .......... H01L/23/36 |

OTHER PUBLICATIONS

Takano, K., "Method of Mounting Power Seminconductor Deivce", *Patent Abstracts of JP*, vol. 1995, No. 06, (Jul. 31, 1995).

Wakashima, Y., "Semiconductor Device", *Patent Abstracts of JP*, vol. 5, No. 179 (E–82), (Nov. 17, 1981).

* cited by examiner

*Primary Examiner*—David L. Talbott
*Assistant Examiner*—John B. Vigushin
(74) *Attorney, Agent, or Firm*—Schwegman, Lundberg, Woessner & Kluth, P.A.

(57) ABSTRACT

Surface mount device packages with increased mounting strength and a method therefor. In one embodiment, an, electronic device is made up of a device package and one or more electrically conductive terminals. For surface mounting, the device terminals are each provided with a mounting surface which is bonded using a conductive adhesive to a corresponding contact pad on a circuit board. The terminals are further provided with at least one groove across the mounting surface. When conductive adhesive is used to mount the device on a circuit board, this groove serves to form the conductive adhesive into a ridge or "dam" over the contact pad. This provides increased mounting strength which may eliminate the need for additional adhesive material to provide side reinforcement of the device, and thereby allow an increase in the packing density of devices on the circuit board.

43 Claims, 2 Drawing Sheets

SURFACE MOUNTED DEVICE WITH GROOVES ON A TERMINATION LEAD

This application is a continuation of U.S. Ser. No. 09/204,531, filed Dec. 3, 1998, now U.S. Pat. No. 6,246,587.

BACKGROUND OF THE INVENTION

1. Field of the Invention

This invention relates generally to the construction of electronic device assemblies which employ surface mount packages, and more particularly to a method for substantially improving the shock resistance of such electronic assemblies.

2. Description of the Related Art

To build sophisticated electronics, such as computers, stereos, medical instrumentation, and more, discrete electronic components, herein referred to as electronic devices, are mounted onto circuit boards. The circuit boards provide a rigid support for the electronic components, and may additionally provide the interconnections between the electronic devices. As used herein, the term "electronic device assembly" refers to a circuit board having one or more electronic devices mounted on its surface.

Surface mount technology (SMT) is a construction technique for electronic device assemblies in which the terminals of electronic devices are attached to the surface of a printed circuit board (PCB),by solder or some other conductive adhesive. In SMT the device terminals each have a flat (planar) contact surface that rests on corresponding conductive "landing pads" on the PCB surface. SMT may be distinguished from other construction techniques which generally employ "through pin" terminals on their electronic device packages. In these other construction techniques, the device terminals are pins which are placed in holes passing through the circuit board and sealed there by solder or some other conductive adhesive.

SMT fabrication permits components to be mounted to both sides of the PCB. As such, a primary advantage which SMT provides over "through pin" construction techniques is the increased packing density, i.e. the number of components on the PCB per unit of area, which may be achieved by mounting electronic devices on both sides of the PCB. A primary disadvantage of SMT is the decreased reliability relative to the "through pin" construction techniques. In the "through pin" techniques, the terminal physically passes through a hole in the board, thereby providing a strong, shock resistant mechanical coupling to the board. In SMT, the terminals are physically coupled to the board only by conductive adhesive. The terminals, and perhaps even the entire device, may separate from the PCB when the terminal and PCB are subjected to a force that exceed the mounting strength of the adhesive. The mounting strength is often measured by determining the minimum force needed to dislodge a terminal from the landing pad. High reliability and a high packing density are both essential for certain electronic device assemblies such as implantable pacemakers and other implantable medical devices. At least one approach exists for improving the reliability of SMT device assemblies. Referring now to FIG. 1, an electronic device package 102 is shown having leads 104, 106 coupled to a PCB by adhesive joints 108, 110. The mechanical coupling between electronic device package 102 and the PCB is further strengthened by a glob 112 of a non-conductive adhesive.

Electronic device package 102 and leads 104, 106 are illustratively typical of those used for capacitors, resistors, and diodes. These and other two- and three-terminal devices tend to have more mass per terminal than most ICs and other electronic devices with more than three terminals. Consequently, when a PCB is accidentally dropped onto a hard surface or in some other manner subjected to excessive shock forces, the adhesive joints of these devices are subjected to higher stresses than other devices with less mass per terminal. To reduce the likelihood of joint failure, additional adhesive is often applied as one or more globs (such as glob 112 in FIG. 1) between the individual packages and the PCB to provide mechanical reinforcement. This technique requires an additional step during construction of the device assembly for applying the additional adhesive, and also requires that the device packages be spaced apart more than is strictly necessary. The additional space is required to provide the device assemblers with the necessary physical and visual access for applying the non-conductive adhesive globs.

A better method for improving the reliability of electronic device assemblies while increasing the packing density and which does not require additional steps during construction of the device assemblies is desirable.

SUMMARY OF THE INVENTION

Accordingly, there is provided herein a method for increasing the mounting strength of surface mount device packages. In one embodiment, an electronic device is made up of a device package and one or more electrically conductive terminals. For surface mounting, the device terminals are each provided with a mounting surface which couples to a corresponding contact pad on a circuit board. To improve the device's mounting strength, the mounting surfaces are provided with at least one groove. When conductive adhesive is used to mount the device a circuit board, this groove serves to form the conductive adhesive into a ridge or "dam" over the contact pad. Measurements show that the presence of this ridge enhances the mounting strength by at least an order of magnitude.

The present invention includes an electronic device assembly with improved reliability and a method for constructing such an assembly. The assembly comprises a circuit board, an electronic device, and conductive adhesive The electronic device has one or more terminals which are configured to be mounted by conductive adhesive on corresponding contact pads on the circuit board. At least one of the terminals is provided with a groove which is configured to form at least some of the conductive adhesive into a ridge over the contact pad.

One contemplated method for constructing such an electronic device assembly comprises: (1) forming a conductive adhesive layer on one or more contact pads on a circuit board; and (2) placing one or more corresponding grooved terminals of an electronic device onto the conductive adhesive to form at least some of the conductive adhesive into a ridge over the contact pad. Certain adhesives may additionally need to be heated and cooled to permanently mount the electronic device on the circuit board.

Another contemplated method for constructing such device assembly comprises: (1) coating a grooved surface of one or more grooved terminals of an electronic device with an electrically conductive adhesive; and (2) placing the coated grooved surface of the one or more terminals against corresponding contact pads on a circuit board. As before, certain adhesives may additionally need to be heated and cooled to mount the electronic device on the circuit board.

BRIEF DESCRIPTION OF THE DRAWINGS

Other objects and advantages of the invention will become apparent upon reading the following detailed description and upon reference to the accompanying drawings in which.

Figure 1:
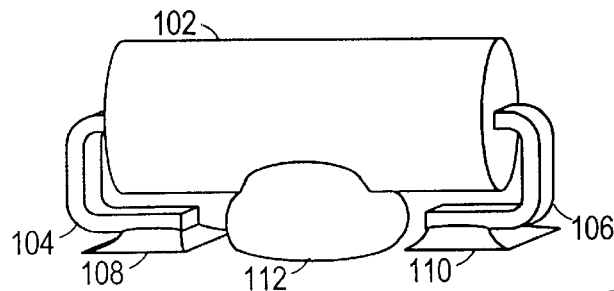
FIG. 1 shows a prior art method for attaching a device to a circuit board using additional adhesive for increased mounting strength.

While the invention is susceptible to various modifications and alternative forms, specific embodiments thereof are shown by way of examples in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 2:
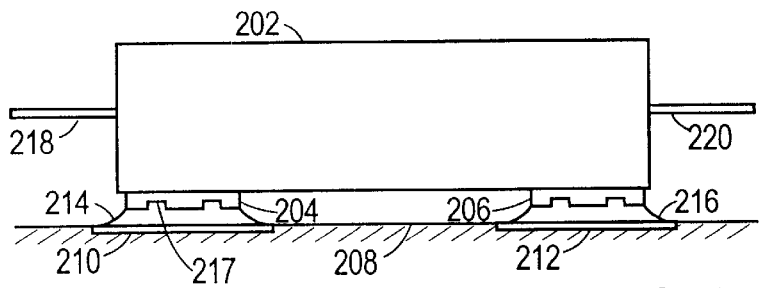
FIG. 2 shows a preferred method of attaching a device to a circuit board and providing for increased mounting strength.

Referring now to FIG. 2, an electronic device package 202 is shown having terminals 204, 206 coupled to landing pads 210, 212 on PCB 208 by exemplary adhesive joints 214, 216. The surface mount technology (SMT) terminals 204, 206 of package 202 are provided with grooves to significantly increase the shock resistance of joints 214, 216. While the following discussion focuses primarily on two-terminal electronic:devices, it should be understood that the surface mount terminals of any electronic device packages, including those of transistors and integrated circuits, may be provided with grooves as described further below to similarly increase their shock resistance when mounted on the surface of a circuit board.

The electronic device package 202 is illustratively typical of a reed switch, and consequently is shown with test terminals 218, 220 which are electrically coupled to terminals 204, 206 respectively. SMT terminals 204, 206 are illustratively shown in the form of electric contact pads on the underside of device package 202. However, SMT terminals also take the form of conductive pins or leads each provided with a flat surface for resting against a corresponding landing pad on the circuit board. Device terminals are generally made from a conductive material such as metal, as are the landing pads. Circuit board 208 may be a multilayer PCB with landing pads on both sides for mounting electronic devices, Alternatively other circuit board types may be used.

Landing pads 210, 212 are conductive contacts located on the surface of circuit board 208. The landing pads may be embedded into or printed (etched) on top of the circuit board surface. Typically the landing pads have superior "wetting" characteristics, that is, the compound which forms the adhesive joints 214, 216 strongly adheres to the landing pads. The adhesive joints 214, 216 may be formed from solder, a conductive epoxy, or some other conductive adhesive.

Figure 3A:
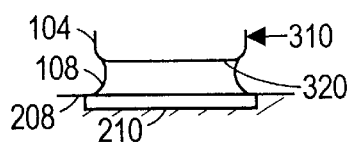
FIG. 3A shows a first SMT joint between a terminal and a landing pad.

Referring now to FIG. 3A, a conventional terminal 104 is shown coupled to a landing pad 210 in a circuit board 208 by an adhesive joint 108. When the terminal 104 is subjected to a strong shearing force 310 (such as an impact) which exceeds the mounting strength of!, adhesive joint 108, failure typically occurs along the contact surface 320 between adhesive joint 108 and terminal 104. The adhesion between the terminal 104 and the joint 108 is overcome, and the electronic device just "pops off".

Figure 3B:
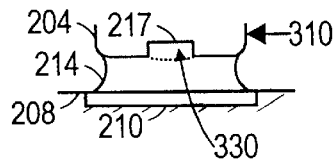
FIG. 3B shows an alternative SMT joint between a terminal and a landing pad.

Referring now to FIG. 3B, a preferred terminal 204 with a groove 217 is shown. Now when terminal 204 is subjected to a similarly strong shearing force 310, the adhesive "dam" 330 withstands the force. For failure to occur, the "dam" or wall 330 formed by the adhesive would have to break (for example, along the dotted line shown in FIG. 3B). For a break to occur, the tensile strength of the adhesive must be overcome. The force required to cause the configuration of FIG. 3B to fail is at least an order of magnitude higher than that of FIG. 3A. By cutting grooves 217 into the surface of device terminals 204, the mounting strength (shock resistance) is increased, the manual adhesive reinforcement operation for conventional devices is eliminated, and the packing density can be increased.

Figure 4:
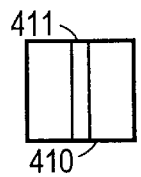
FIG. 4 shows bottom views of a terminal mounting surface provided with various groove patterns for increasing the shock resistance of an SMT joint.
Figure 4:
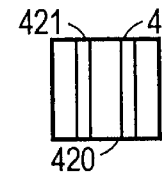
Figure 4:
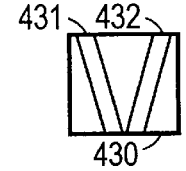
Figure 4:
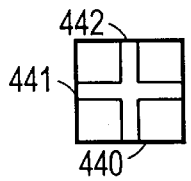
Figure 4:
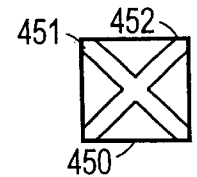
Figure 4:
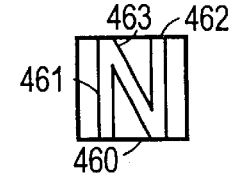
Figure 4:
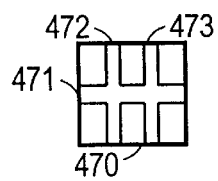
Figure 4:
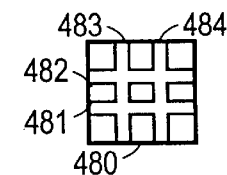
Figure 4:
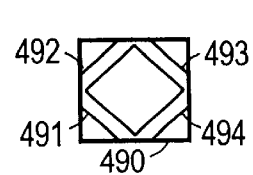

FIG. 4 shows a bottom view of terminal mounting surfaces 410–490 with various illustrative groove patterns which may be cut into the terminal mounting surfaces to increase mounting strength. Terminal surface 410, for example, has a single groove 411 which may run axially along a terminal lead, but preferably is oriented perpendicular to the long axis of the device package. Further reinforcement may be provided by cutting, two approximately parallel grooves 421, 422 as shown on terminal surface 420. Reinforcement against shocks in a perpendicular direction may be provided by cutting two grooves 431, 432 at an angle to each other as shown on terminal surface 430. Two dimensional shock protection may preferably be provided by cutting the grooves approximately perpendicular to each other as shown by grooves 441, 442 on surface 440, or alternatively as shown by grooves 451, 452 on surface 450.

Three or more grooves may be used. Terminal surface 460 is shown having two parallel grooves 461, 462, with a third groove 463 cut at an angle between them. Terminal surface 470 shows two parallel grooves 472, 473 with a third groove 471 cut perpendicular to them. Terminal surface 480 shows two parallel grooves 481, 482 with two more parallel grooves 483, 484 cut perpendicular to them. Terminal surface 490 shows four grooves 491, 492, 493, 494 generally arranged in a diamond formation. Although the surfaces 440, 450, 470, 480, and 490 show the angles between the grooves to be generally right angles, these angles can be other than 90 degrees.

Any other pattern of one or more grooves also may be used to increase the mounting strength of the device terminal. In addition to allowing the formation of adhesive dam structures, the grooves may additionally provide increased surface area. The grooves may be formed into the terminal surfaces as the terminals are created, or they may be cut into the terminal surfaces at a later time. For device terminals having a roughly square mounting surface ranging from about 1 to 1.6 mm$^2$, and a device terminal thickness of about 0.64 mm over the mounting surface, the groove widths used are about 0.45 to 0.51 mm and the groove depths used are about 0.15 to 0.2 mm. Other dimensions and geometries are contemplated, and optimal groove dimensions and patterns may be determined by theoretical modeling or experimentation for any given device. In one embodiment, the groove depth may be about ⅓ of the device terminal thickness in the region of the mounting surface.

Figure 5:
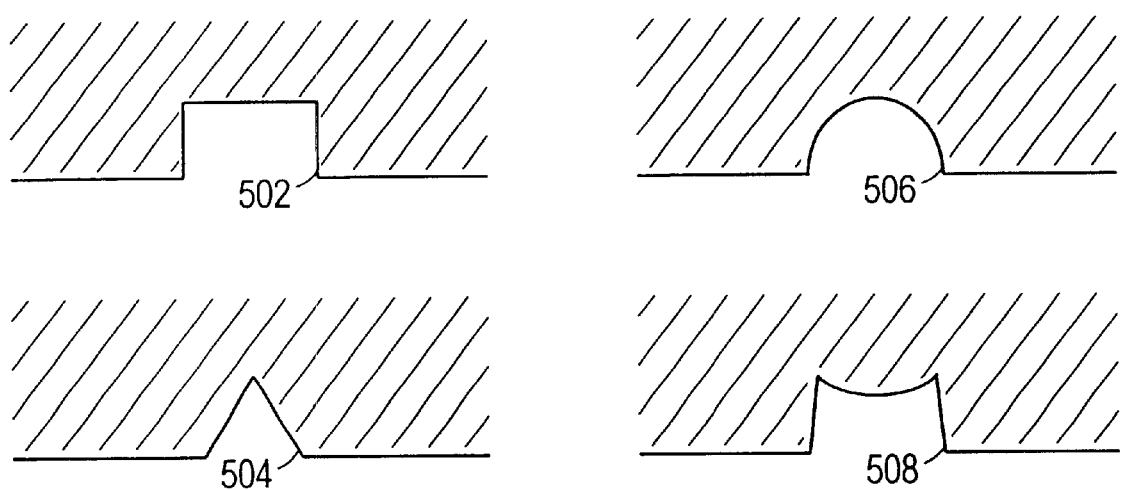
FIG. 5 is a plan view of a terminal mounting surface showing various contemplated groove cross-sections.

The grooves 217 may have any one of a variety of cross-sectional shapes. For example, FIG. 5 shows the grooves may have a rectangular cross-section 502. Alternatively, a triangular cross-section 504 or a round cross-section 506 may prove to have similar mounting strength enhancement and may be easier to cut. A custom designed cross-section 508 may be able to provide even greater mounting strength enhancement. The grooves 217 may have other cross-sectional shapes not specifically shown in FIG. 5.

Numerous variations and modifications will become apparent to those skilled in the art once the above disclosure is fully appreciated. For example, rather than cutting the grooves into the terminal surface, the grooves may be created by adding parallel ridges on the terminal surface. Additionally, the landing pads may similarly be provided with grooves or ridges to further enhance the mounting strength. It is intended that the following claims be interpreted to embrace all such variations and modifications.

What is claimed is:

1. An electronic device, wherein the device comprises:
   a device package; and
   an electrically conductive terminal connected to the:
      device package and configured with a mounting surface for mounting to an electrically conductive contact pad;
      wherein the mounting surface is provided with two grooves configured in an ordered pattern and having an oblique angle with respect to each other.

2. An electronic device with improved mounting strength, wherein the device comprises:
   a device package; and
   an electrically conductive terminal connected to the device package, wherein the terminal is configured with a mounting surface for mounting to an electrically conductive contact pad on a circuit board;
   wherein the mounting surface is provided with at least two grooves for forming an adhesive dam; and
   wherein the at least two grooves are configured in an ordered pattern and two of the at least two grooves have an oblique angle with respect to each other.

3. The electronic device of claim 2, wherein there are at least three grooves and two of the at least three grooves are substantially parallel.

4. The electronic device of claim 2, wherein two of the at least two grooves have an oblique angle with respect to a longitudinal axis of the device package.

5. The electronic device of claim 2, wherein the mounting surface has at least three grooves.

6. The electronic device of claim 5, wherein two of the at least two grooves are substantially perpendicular.

7. The electronic device of claim 5, wherein two of the at least three grooves are substantially parallel and a third has an oblique angle with respect to the other two.

8. The electronic device of claim 2, wherein the mounting surface is provided with at least four grooves.

9. The electronic device of claim 8, wherein two of the at least four grooves are substantially parallel.

10. The electronic device of claim 2, wherein each of the at least two grooves have a substantially rectangular cross-section.

11. The electronic device of claim 2, wherein each of the at least two grooves have a substantially triangular cross-section.

12. The electronic device of claim 2, wherein each of the at least two grooves have a substantially rounded cross-section.

13. The electronic device of claim 2 further comprising a second electrically conductive terminal connected to the device package and configured with a second mounting surface for coupling to an electrically conductive contact pad on a circuit board.

14. The electronic device of claim 13, wherein the second mounting surface is also provided with a groove for forming an adhesive dam.

15. An electronic device assembly which comprises:
    a circuit board having one or more conductive contact pads;
    an electronic device having one or more terminals configured to be mounted on corresponding contact pads on the circuit board; and
    conductive adhesive for coupling the one or more terminals to the corresponding contact pads;
    wherein a contact surface on at least one of the terminals is provided with at least two grooves, and wherein each groove is configured to form at least some of the conductive adhesive into a ridge over the corresponding contact pad; and
    wherein the at least two grooves are configured in an ordered pattern and two of the at least two grooves have an oblique angle with respect to each other.

16. The electronic device assembly of claim 15, wherein the conductive adhesive comprises epoxy.

17. The electronic device assembly of claim 15, wherein the electronic device comprises a device from the set comprising a resistor, a capacitor, an inductor, a transformer, a diode; a transistor, an integrated circuit, and a microswitch.

18. The electronic device assembly of claim 15, wherein the electronic device comprises a tantalum capacitor.

19. The electronic device assembly of claim 15, wherein the electronic device comprises a reed-switch.

20. The electronic device assembly of claim 15, wherein the contact surface on at least one of the terminals has at least three grooves and two of the at least three grooves are substantially parallel.

21. The electronic device assembly of claim 15, wherein two of the at least two grooves have an oblique angle with respect to a longitudinal axis of the electronic device.

22. The electronic device assembly of claim 15, wherein the contact surface on at least one of the terminals has at least three grooves.

23. The electronic device assembly of claim 22, wherein two of the at least three grooves are substantially parallel and a third is angled with respect to the other two.

24. The electronic device assembly of claim 22, wherein two of the at least three grooves are substantially parallel and a third groove has an oblique angle with respect to a longitudinal axis of the electronic device.

25. The electronic device assembly of claim 15, wherein the contact surface on at least one of the terminals is provided with at least four grooves.

26. The electronic device assembly of claim 25, wherein two of the at least four grooves are substantially parallel.

27. The electronic device assembly of claim 15, wherein each of the at least two grooves have a substantially rectangular cross-section.

28. The electronic device assembly of claim 15, wherein each of the at least two grooves have a substantially triangular cross-section.

29. The electronic device assembly of claim 15, wherein each of the at least two grooves have a substantially rounded cross-section.

30. The electronic device assembly of claim 15, wherein the electronic device further includes a second terminal having a contact surface and configured to be mounted on a corresponding contact pad on the circuit board.

31. The electronic device assembly of claim 30, wherein the second terminal also has a groove on its contact surface for forming an adhesive dam.

32. A method of constructing an electronic device assembly, wherein the method comprises:
  forming a conductive adhesive layer on one or more contact pads on a circuit board; and
  placing one or more corresponding grooved terminals of a contact surface of an electronic device onto the conductive adhesive to form at least some of the conductive adhesive into a ridge over the contact pad;
  wherein at least one of the one or more corresponding grooved terminals includes at least two grooves on its contact surface; and
  wherein the at least two grooves are configured in an ordered pattern and two of the at least two grooves have an oblique angle with respect to each other.

33. A method for constructing an electronic device assembly, wherein the method comprises:
  coating a grooved contact surface of one or more grooved terminals of an electronic device with an electrically conductive adhesive; and
  placing the coated grooved contact surface of the one, or more grooved terminals against corresponding contact pads on a circuit board;
  wherein at least one grooved planar contact surface includes at least two grooves; and
  wherein the at least two grooves are configured in an ordered pattern and two of the at least two grooves have an oblique angle with respect to each other.

34. An electronic device, wherein the device comprises:
  a device package; and
  an electrically conductive terminal connected to the, device package and configured with a mounting surface for mounting to an electrically conductive contact pad;
  wherein the mounting surface is provided with at least three grooves; and
  wherein the at least three grooves are configured in an ordered pattern and two of the at least three grooves have an oblique angle with respect to each other.

35. The electronic device of claim 34, wherein three grooves of the at least three grooves are arranged in a manner wherein two of the three grooves are substantially parallel and a third is angled with respect to the other two.

36. An electronic device, wherein the device comprises:
  a device package; and
  an electrically conductive terminal connected to the device package and configured with a mounting surface for mounting to an electrically conductive contact pad;
  wherein the mounting surface is provided with at least four grooves; and
  wherein the at least four grooves are configured in an ordered pattern and two of the at least four grooves have an oblique angle with respect to a longitudinal axis of the device package.

37. The electronic device of claim 35, wherein two of the at least four grooves are substantially parallel and another two of the at least four grooves are substantially perpendicular to the first two.

38. An electronic device with improved mounting strength, wherein the device comprises:
  a device package; and
  an electrically conductive terminal connected to the device package, wherein the terminal is configured with a mounting surface for mounting to an electrically conductive contact pad on a circuit board;
  wherein the mounting surface is provided with at least two grooves for forming an adhesive dam, wherein the at least two grooves are configured in an ordered pattern and two of the at least two grooves are obliquely angled with respect to each other; and
  wherein the at least two grooves have a cross-section selected from the group consisting of a substantially rectangular cross-section, a substantially triangular cross-section, and a substantially rounded cross-section.

39. The electronic device of claim 38, further comprising a second electrically conductive terminal connected to the device package and configured with a second mounting surface for coupling to an electrically conductive contact pad on a circuit board.

40. The electronic device of claim 39, wherein the second mounting surface is also provided with a groove for forming an adhesive dam.

41. An electronic device assembly which comprises:
  a circuit board having one or more conductive contact pads;
  an electronic device having one or more terminals configured to be mounted on corresponding contact pads on the circuit board; and
  conductive adhesive for coupling the one or more terminals to the corresponding contact pads;
  wherein a contact surface on at least one of the terminals is provided with at least one groove, and wherein the at least one groove is configured to form at least some of the conductive adhesive into a ridge over the corresponding contact pad; and
  wherein the at least one groove is configured in an ordered pattern and has an oblique angle with respect to a longitudinal axis of the electronic device and has a cross-section selected from the group consisting of a substantially rectangular cross-section, a substantially triangular cross-section, and a substantially rounded cross-section.

42. The electronic device assembly of claim 41, wherein the electronic device further includes a second terminal having a contact surface and configured to be mounted on a corresponding contact pad on the circuit board.

43. The electronic device assembly of claim 42, wherein the second terminal also has a groove on its contact surface for forming an adhesive dam.

* * * * *

UNITED STATES PATENT AND TRADEMARK OFFICE
CERTIFICATE OF CORRECTION

PATENT NO.    : 6,426,880 B1
DATED         : July 30, 2002
INVENTOR(S)   : Chen

It is certified that error appears in the above-identified patent and that said Letters Patent is hereby corrected as shown below:

<u>Title page,</u>
Item [75], delete "Tigart" and insert -- Tigard --, therefor.

<u>Column 5,</u>
Line 21, delete "connected to the:" and insert -- connected to the --, therefor.
Line 49, delete "perpendicular" and insert -- parallel and a third is angled with respect to the other two --, therefor.

<u>Column 7,</u>
Line 35, delete "connected to the," and insert -- connected to the --, therefor.

Signed and Sealed this

Seventh Day of January, 2003

JAMES E. ROGAN
*Director of the United States Patent and Trademark Office*